(12) United States Patent
Mengel et al.

(10) Patent No.: US 8,101,463 B2
(45) Date of Patent: Jan. 24, 2012

(54) METHOD OF MANUFACTURING A SEMICONDUCTOR DEVICE

(75) Inventors: Manfred Mengel, Bad Abbach (DE); Joachim Mahler, Regensburg (DE); Stefan Landau, Wehrheim (DE)

(73) Assignee: Infineon Technologies AG, Neubiberg (DE)

( * ) Notice: Subject to any disclaimer, the term of this patent is extended or adjusted under 35 U.S.C. 154(b) by 287 days.

(21) Appl. No.: 12/370,437

(22) Filed: Feb. 12, 2009

(65) Prior Publication Data

US 2010/0200978 A1    Aug. 12, 2010

(51) Int. Cl.
*H01L 21/60* (2006.01)

(52) U.S. Cl. .. 438/111; 438/124; 438/768; 257/E21.499

(58) Field of Classification Search ............... 438/111, 438/112, 124, 126, 127, 768; 257/E21.499
See application file for complete search history.

(56) References Cited

U.S. PATENT DOCUMENTS

| 5,457,862 | A | 10/1995 | Sakata et al. | |
|---|---|---|---|---|
| 6,674,635 | B1 | 1/2004 | Fife et al. | |
| 7,443,019 | B2 | 10/2008 | Bauer et al. | |
| 2005/0039840 | A1 | 2/2005 | Foster et al. | |
| 2005/0046001 | A1* | 3/2005 | Warner | 257/678 |
| 2007/0034997 | A1* | 2/2007 | Bauer et al. | 257/676 |
| 2007/0040260 | A1* | 2/2007 | Otremba | 257/686 |
| 2009/0127547 | A1* | 5/2009 | Luebben et al. | 257/40 |
| 2009/0167288 | A1* | 7/2009 | Reid et al. | 324/72 |
| 2010/0187700 | A1 | 7/2010 | Weidner | |

FOREIGN PATENT DOCUMENTS

| DE | 102005037321 | 2/2007 |
|---|---|---|
| DE | 102006040724 | 3/2008 |

* cited by examiner

*Primary Examiner* — Tuan N. Quach

(74) *Attorney, Agent, or Firm* — Dicke, Billig & Czaja, PLLC

(57) ABSTRACT

A method of manufacturing a semiconductor device includes placing a chip on a carrier, and applying an electrically conducting layer to the chip and the carrier. The method additionally includes converting the electrically conducting layer into an electrically insulating layer.

16 Claims, 6 Drawing Sheets

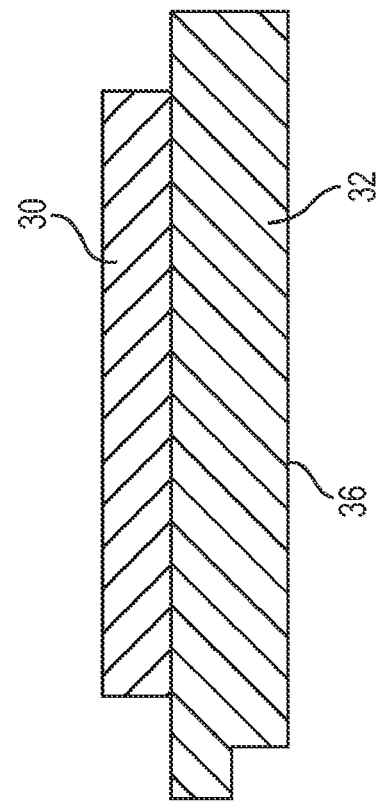
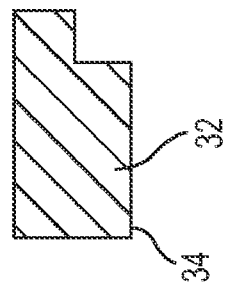

METHOD OF MANUFACTURING A SEMICONDUCTOR DEVICE

BACKGROUND

Semiconductor packages include one or more semiconductor chips having connections that are protectively enclosed in an encapsulation material and/or mold compound. Semiconductor packages are commonly employed in a wide range of electronic devices, such as mobile devices, and in a wide variety of applications, including telecommunication and automotive applications.

Power semiconductor packages have conductive strips for guiding signals from the chip(s) to contacts outside the package. The conductive strips are provided with metal that is deposited over or onto dielectric portions of the chip(s). The dielectric portions of the chip(s) are seeded with metal or compounds that are receptive to the metal deposition of the conductive strips. Additive processes such as ink jet printing or photolithography, for example, are subsequently employed to process the seeded dielectric portions into metal conductive strips. The seeding and the additive processes can present challenges to the package fabrication process and add expense to the finished semiconductor device.

For these and other reasons there is a need for the present invention.

SUMMARY

One embodiment provides a method of manufacturing a semiconductor device. The method includes providing a chip on a carrier, and applying an electrically conducting layer to the chip and the carrier. The method additionally includes converting the electrically conducting layer into an electrically insulating layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2 is a schematic cross-sectional view of a chip attached to a carrier.

FIG. 3 is a schematic cross-sectional view of the chip attached to the carrier illustrated in FIG. 2 including an electrically conducting layer applied to portions of the chip and the carrier according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide a semiconductor device including a convertible polymer layer that is deposited on at least a portion of a chip and a carrier of the semiconductor device, where the convertible layer is deposited as an electrically conducting layer and subsequently converted to an electrically insulating layer.

Embodiments provide depositing an electrically conducting layer over portions of a chip and a carrier, where the electrically conducting layer is suited for receiving a metallization layer useful in establishing electrical connection to the chip. After the metallization layer is deposited, the electrically conducting layer is converted to an electrically insulating layer.

Embodiments provide a polymer layer that is deposited onto portions of a chip and a carrier, where the polymer layer is configured to be structured and/or patterned to include metallized traces or other forms of connection. In one embodiment, the polymer layer includes a dopant or other activating agent that configures the polymer layer to be electrically conducting. A metallized layer is applied to the doped/activated polymer layer, after which the doped/activated polymer layer is deactivated or "de-doped" to convert the polymer layer to an electrically insulating layer. Activation of the polymer layer to an electrically conducting state is accomplished without having to seed the polymer layer, which can be expensive and include additional process steps. Thus, the electrically conducting is suited for melt processing in its conducting state. Deactivation of the doped polymer layer is accomplished with low temperature or other processes that are consistent with semiconductor fabrication.

Figure 1A:
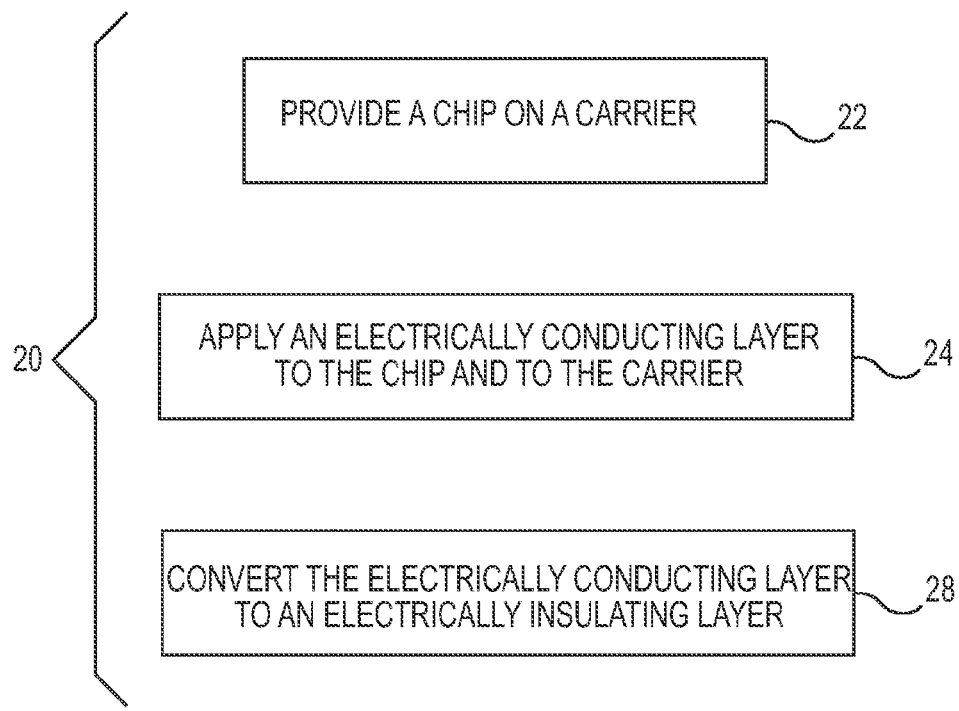
FIG. 1A is a block diagram of a process for manufacturing a semiconductor device according to one embodiment.

FIG. 1A is a block diagram of a process 20 for manufacturing a semiconductor device according to one embodiment. Process 20 includes providing a chip on a carrier at 22. At 24, an electrically conducting layer is applied to the chip and to the carrier. At 28 the electrically conducting layer is converted to an electrically insulating layer.

Figure 1B:
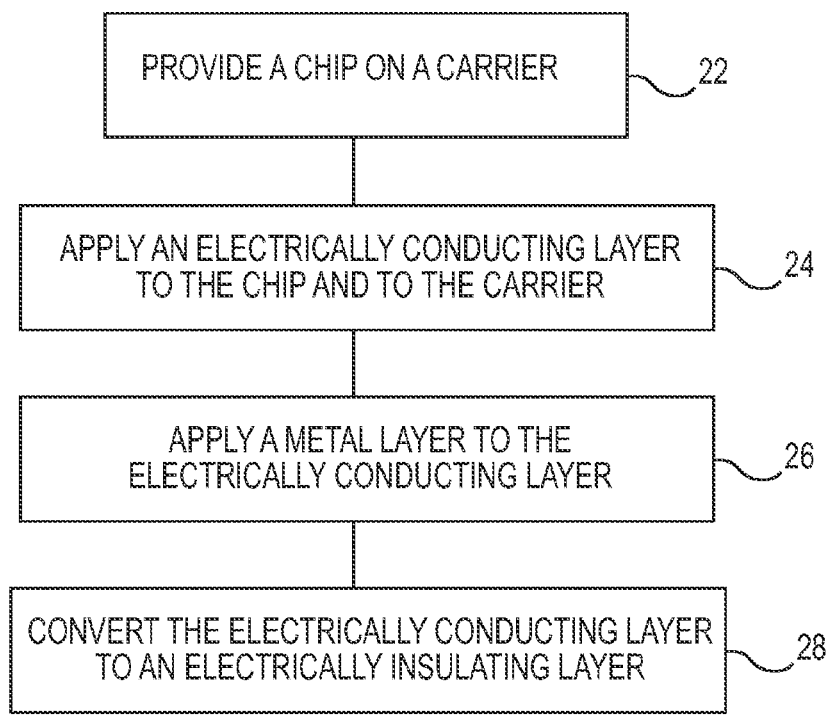
FIG. 1B is another block diagram of a process for manufacturing a semiconductor device according to one embodiment.

FIG. 1B is another block diagram of a process for manufacturing a semiconductor device according to one embodiment. In one embodiment, an additional layer, for example a metal layer, is applied at 26 to the electrically conducting layer and patterned/structured before the electrically conducting layer is converted to an electrically insulating layer. The metal layer bonds by affinity to the electrically conducting layer. Thereafter, the electrically conducting layer is converted to an electrically insulating layer.

FIG. 2 is a schematic cross-sectional view of a chip 30 attached to a carrier 32. Process 20 (FIG. 1A) and embodiments described herein are compatible with any suitable semiconductor chip 30. Suitable semiconductor chips include integrated circuits configured as logic circuits, control circuits, microprocessors, or microelectrical-mechanical components. In one embodiment, one or more chip 30 is deposited onto carrier 32 in either a side-by-side or a stacked configuration. Chip(s) 30 includes power semiconductor chips such as power transistors, power diodes, insulated gate bi-polar transistors, or other such power devices. Other suitable chips include vertical structure chips configured such that electric current flows in the Z direction perpendicular to carrier 32. Other suitable chips 30 include flip chips. In one embodiment, chip 30 includes a transistor having a first electrode on a first main face and a second electrode on a second main face opposite the first main face.

Process 20 (FIG. 1A) is compatible with a variety of carriers 32. Suitable carriers 32 include substrates or leadframes or printed circuit boards. Suitable substrates include laminate substrates configured for ball grid array attachment, flex substrates, ceramic substrates, or silicon substrates. Suitable leadframes include leaded leadframes including thin outline leaded leadframes, dual in-line packages, or quad flat packages. Suitable non-leaded leadframes include very thin outline quad flat non-leaded packages or thin small leadless packages. In one embodiment, carrier 32 is provided as a leadframe and includes subsequent connection layers configured to communicate to the outside world. In one embodiment, leadframe 32 is provided with a source contact 34 separated from chip 30, and a drain contact 36. In one embodiment, carrier 32 is provided as a printed circuit board and chip is electrically connected to contacts on the board. In one embodiment, carrier 32 is provided as a printed circuit board, and a portion of the printed circuit board is covered with a convertible layer that is deposited as an electrically conducting layer and subsequently converted to an electrically insulating layer.

FIG. 3 is a schematic cross-sectional view of an electrically conducting layer 40 deposited over a portion of chip 30 and a portion of carrier 32 according to one embodiment. Electrically conducting layer 40 (ECL 40) has an electrical conductivity of between approximately 0.1 to 80,000 Siemens per cm (S/cm).

In one embodiment, ECL 40 is provided as an organic conductive polymer that is doped to introduce charge carriers and provide the organic conductive polymer with an electrical conductivity similar to silver ($10^5$ S/cm). Suitable such organic conductive polymers include polythiophene, polypyrrole, polysulfonen, polyaniline, polyindophenine, polystyrene derivatives, and PEDT or poly (3,4-ethylendioxythiophen) that are doped and/or activated to an electrically conducting state by electron addition or electron removal.

Suitable such organic conductive polymers that are activated to an electrically conducting state include conjugated chains having sp2 hybridized carbons. For example, polyacetylene is a conjugated polymer (CH)x having three in-plane sigma-orbitals of sp2 hybridized carbon that form a backbone. Two of the three in-plane sigma-orbital are bonded to neighboring carbons and the third sigma-orbital is bonded to a hydrogen atom. A fourth electron resides in the pz orbital and is orthogonal to the plane defined by the other three sigma bonds and is called a pi-electron. The pi-electron on the neighboring carbons forms a weak pi-pi bond of an alternating bond structure. Consequently, polyacetylene is a semiconductor with low electrical conductivity in its ground state. The electrical conductivity of polyacetylene (and other such suitable organic conductive polymers) is increased by a factor of up to $10^8$ by doping with charge carriers to form doped conjugate polymers or conducting polymers. In one example, oxidation of polyacetylene with iodine results in a $10^8$ increase in electrical conductivity for the polymer system.

Another suitable organic conductive polymer that is activated to an electrically conducting state includes an endowed form of PEDT identified as Baytron® M available from Bayer AG.

The doping of the organic conductive polymer with charge carriers (by the addition or removal of electrons) increases the electrical conductivity of the material. In one embodiment, the organic conductive polymer provides is an electrical insulator before the polymer is doped and has an electrical conductivity on the order of $10^{-8}$ S/cm. Upon doping, the conjugated polymer has electrical conductivity that is increased by a factor of up to $10^8$ S/cm even at a very low doping level of less than one percent.

Doping of the organic conductive polymer to form ECL 40 includes chemical doping and electro-chemical doping. In one embodiment, the organic conductive polymer is chemical doped by exposing the polymer to an oxidant (for example iodine or bromine) or a reductant such as an alkali metal. In one embodiment, the polymer is electrochemically doped to form ECL 40. In one embodiment, the semiconductor device including chip 30 and the organic conductive polymer layer coated on chip 30 is introduced into an electrolyte solution and exposed to an electric potential difference that causes a charge (and an appropriate counter ion form the electrolyte) to enter the polymer in the form of electron addition (n-doping) or electron removal (p-doping). In general, chemical n-doping is conducted in an inert gas environment to prevent oxygen from reacting with the electron rich n-doped polymer.

In one embodiment, the selected organic conductive polymer is activated by electron addition/removal by introducing a molecule that acts as an electron donor to make the resulting polymer highly electrically conductive. Examples of suitable molecules configured to donate electrons to the organic conductive polymers include oxidizing agents or arsenpentafluorid. The addition of charge carriers from the addition or removal of electrons into the conduction or valence bands increases the electrical conductivity of the polymer dramatically. Suitable molecules for electron donation include melanin, iodine, or bromine ECL 40 is deposited from the melt or in solution onto a portion of chip 30 and a portion of carrier 32 in an electrically conducting state. ECL 40 has thermal stability of greater than 250 degrees Celsius and when doped has a high specific conductivity of about $10^{-3}$ Ohm/cm. ECL 40 is, as such, suited for deposition as a conductive strip on semiconductor devices and printed circuit boards. As examples, ECL 40 is deposited onto chip 30 and carrier 32 by dipping, spin coating, spraying, dispersion, printing, or other suitable forms of deposition. ECL 40 has an affinity and forms a strong bond with other conducting materials, such as metal carriers.

In accord with both FIGS. 1A and 1B, in one embodiment an electrically insulating polymer layer is first deposited on chip/carrier and then subsequently activated to be an electrically conducting polymer. For example, in one embodiment polymer is deposited over a portion of chip 30 and a portion of carrier 32, where the polymer layer is electrically non-conducting. The polymer layer is doped and/or activated and provided with charge carriers (by the addition or removal of electrons) to increase the electrical conductivity of the polymer. A metal layer is deposited onto the activated (electrically conducting) polymer. Thereafter, the electrically conducting polymer is deactivated to an electrically insulating state by embodiments described herein.

Figure 4:
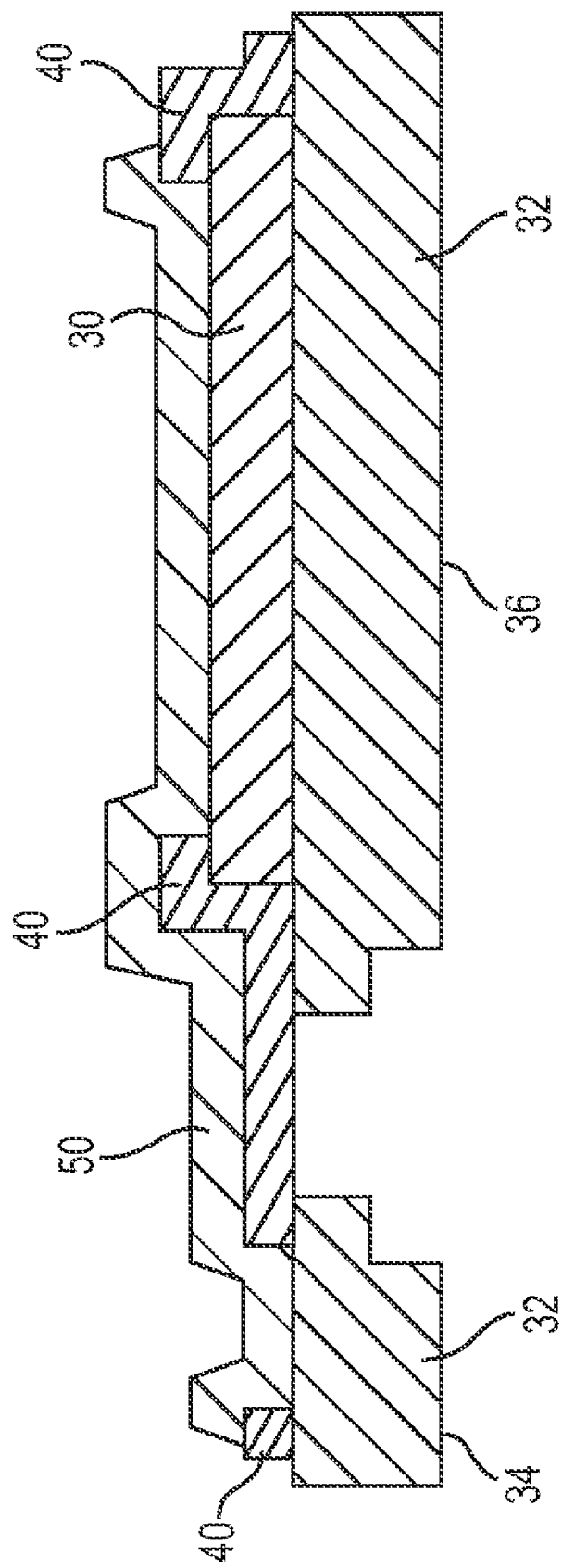
FIG. 4 is a schematic cross-sectional view of the semiconductor device illustrated in FIG. 3 including a metal layer applied to the electrically conducting layer according to one embodiment.

FIG. 4 is a schematic cross-sectional view of a metal layer 50 applied to ECL 40. In one embodiment, metal layer 50 is applied to ECL 40, a portion of chip 30, and a portion of carrier 32.

In one embodiment, metal layer 50 is provided as a single layer of metal such as copper, silver, aluminum, gold, or alloys of these metals. In one embodiment, metal layer 50 is provided as multiple layers of such metals and/or compositions of such metals and deposited on ECL 40 and a portion of chip 30 and carrier 32.

Deposition and bonding of metal layer 50 to ECL 40 is enhanced by the electrical conductivity of ECL 40. Metal layer 50 is applied to ECL 40 in a suitable deposition process, such as printing, spraying, galvanic deposition, electrolytic deposition, dipping, or printing.

Figure 5:
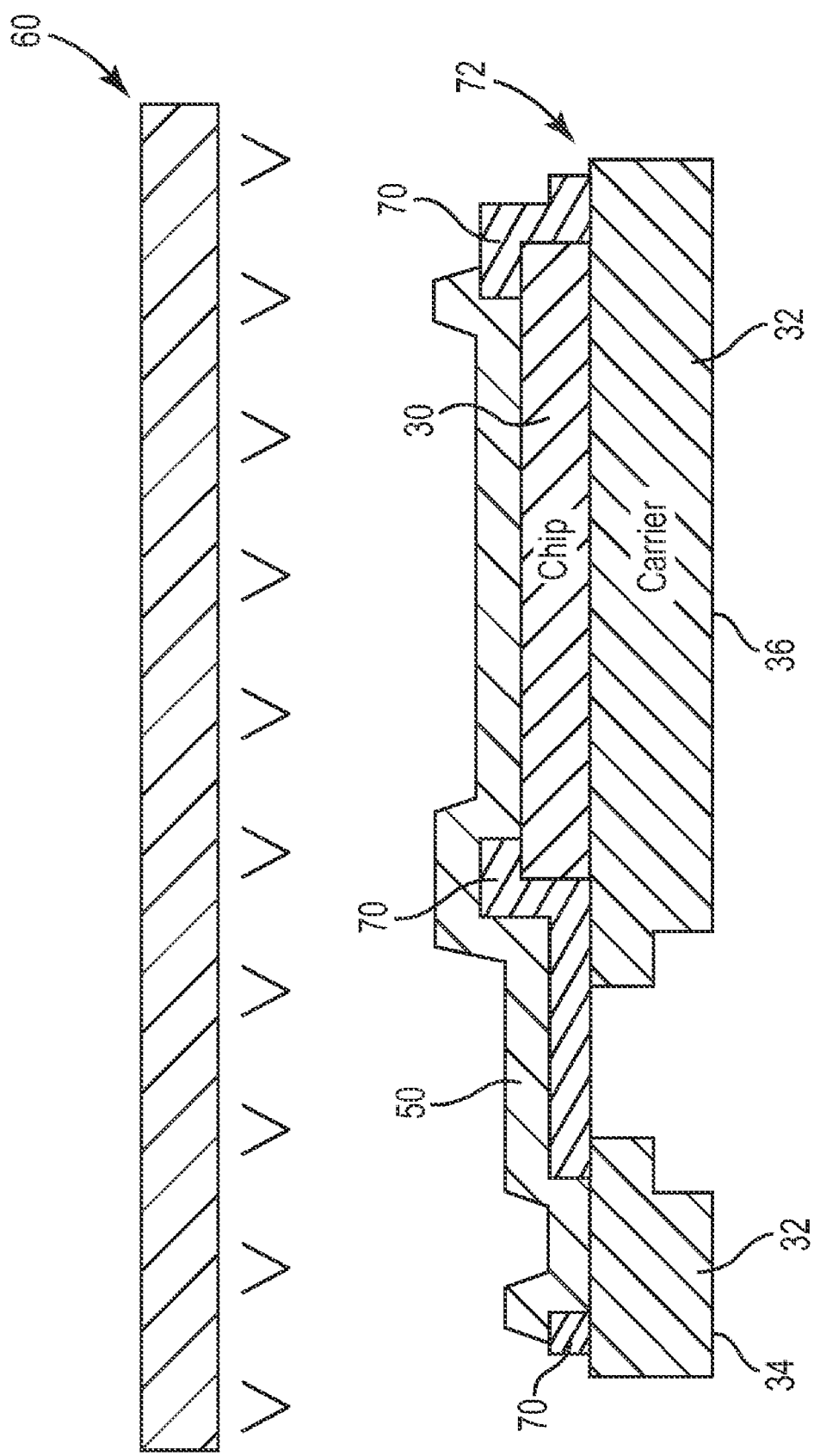
FIG. 5 is a schematic cross-sectional view of a conversion process employed to convert the electrically conducting layer illustrated in FIG. 4 into an electrically insulating layer according to one embodiment.

FIG. 5 is a schematic cross-sectional view of a conversion process 60 for semiconductor device 72. Conversion process 60 converts ECL 40 (FIG. 4) into an electrically insulating layer 70 according to one embodiment. Metal layer 50 extends over electrically insulating layer 70 and forms a connection between source contact 34 and drain contact 36 through chip 30 and carrier 32.

In one embodiment, conversion process 60 is configured to deactivate or de-dope the charge carrier introduced into ECL 40 (FIG. 4). For example, in one embodiment conversion process 60 provides an oxidizing environment configured to re-oxidize electron-rich charge carriers in ECL 40 to a neutral state, thus converting ECL 40 to an electrically insulating layer 70.

In one embodiment, conversion process 60 provides a thermal bath configured to heat and deactivate charged carriers in ECL 40 (FIG. 4) to convert ECL 40 to an electrically insulating layer 70. For example, one embodiment of conversion process 60 heats semiconductor device 72 to 300 degrees Celsius or more in the presence of oxygen to deactive electrically conducting layer 40 (FIG. 4) and convert it to electrically insulating layer 70.

In one embodiment, conversion process 60 includes a laser or other light source configured to deactivate charge carriers in ECL 40 (FIG. 4) to convert ECL 40 to an electrically insulating layer 70.

In one embodiment, conversion process 60 is configured to chemically deactivate charged carriers in ECL 40 (FIG. 4) by oxidizing or otherwise neutralizing the charge carriers to convert ECL 40 to electrically insulating layer 70.

Figure 6A:
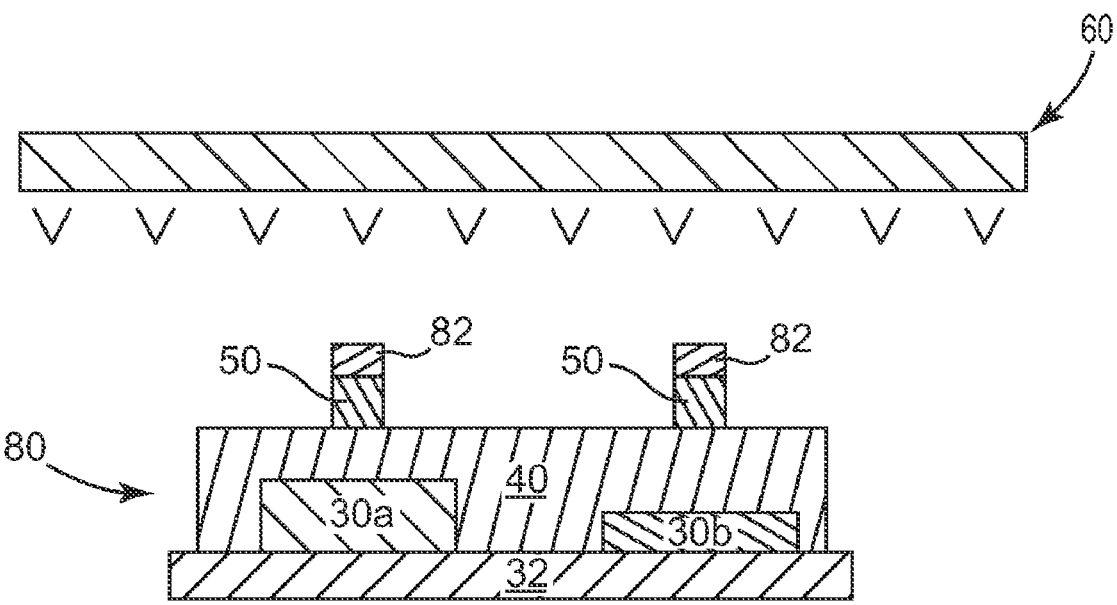
FIG. 6A is a schematic cross-sectional view of a semiconductor device including a mask employed to protect portions of an electrically conducting layer from the conversion process according to one embodiment.
Figure 6B:
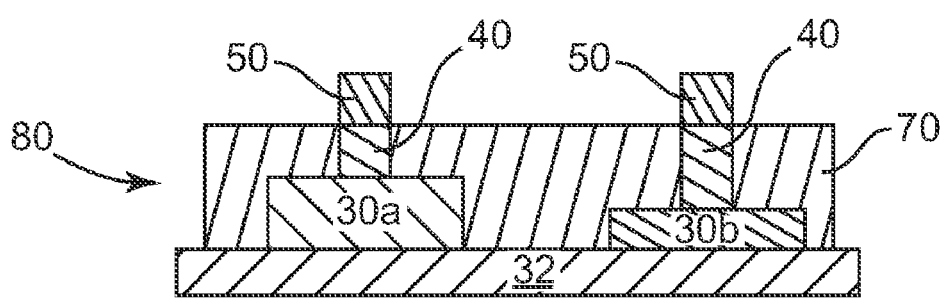
FIG. 6B is a schematic cross-sectional view of the semiconductor device illustrated in FIG. 6A after removal of the mask, where the conversion process has converted an exposed portion of the electrically conducting layer illustrated in FIG. 6A into an electrically insulating layer according to one embodiment.

FIGS. 6A and 6B are schematic cross-sectional views of conversion process 60 employed with a mask 80 to selectively pattern ECL 40 according to one embodiment.

FIG. 6A is a schematic cross-sectional view of conversion process 60 incident on a semiconductor device 80 according to one embodiment. Semiconductor device 80 includes multiple chips 30a and 30b attached to carrier 32 with ECL 40 applied to chips 30a, 30b and carrier 32. Metal layer 50 is patterned on ECL 40 and includes a mask 82. In one embodiment, conversion process 60 is an energetic process, for example a laser or a light or a photolithographic process, and mask 82 covers metal layer 50 and a portion of ECL 40.

In one embodiment, conversion process 60 converts that portion of ECL 40 that is not covered by mask 82 into an electrically insulating state. In one embodiment, conversion process 60 converts that portion of ECL 40 that is covered by mask 82 into an electrically insulating state. That is to say, mask 82 includes positive masks and negative masks depending upon the application.

FIG. 6B is a schematic cross-sectional view of semiconductor device 80 with mask 82 (FIG. 6A) removed. Metal layer 50 and that portion of ECL 40 that was under mask 82 (FIG. 6A) remains in the electrically conducting state, and is in contact with chip 30a and chip 30b. That portion of ECL 40 (FIG. 6A) exposed to conversion process 60 has been converted to an electrically insulating layer 70. In other words, metal layer 50 and ECL 40 have been patterned in contact with chips 30a, 30b and that portion of ECL 40 that has been exposed to conversion process 60 (FIG. 6A) has been converted to an electrically insulating layer 70.

Figure 7:
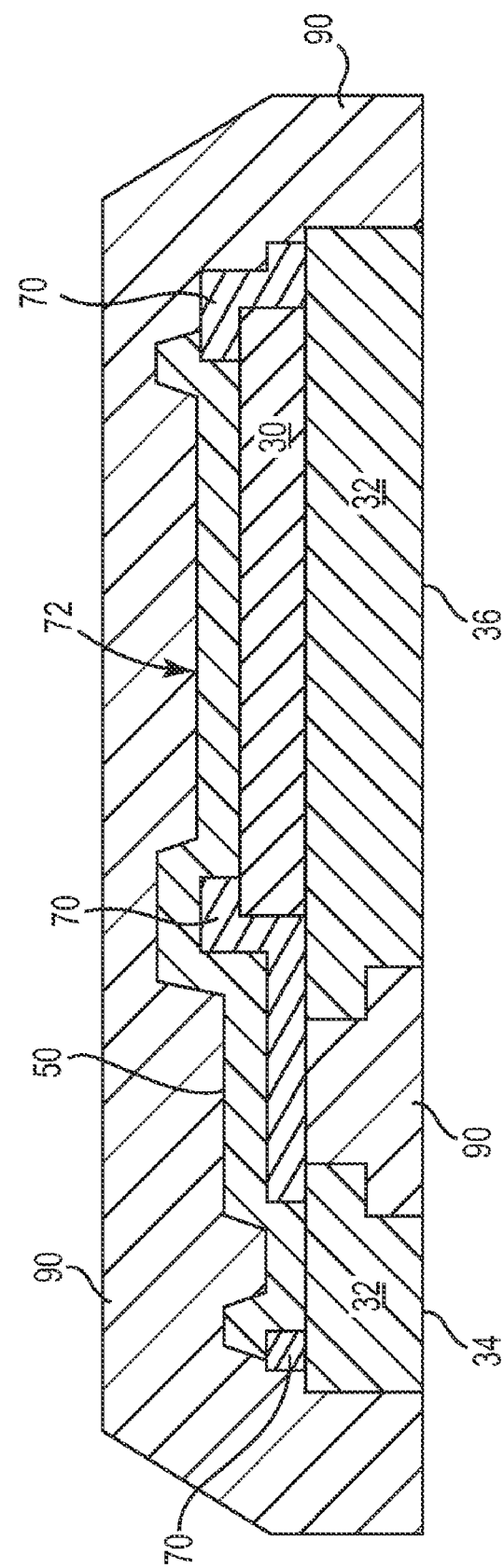
FIG. 7 is a schematic cross-sectional view of the semiconductor device of FIG. 4 including encapsulation material according to one embodiment.

FIG. 7 is a schematic cross-sectional view of the semiconductor device 72 illustrated in FIG. 5 including encapsulation material 90. Encapsulation material 90 is deposited over metal layer 50 and electrically insulating layer 70 to protect chip 30. In one embodiment, encapsulation material 90 is deposited over semiconductor device 72 in a transfer molding process. In one embodiment, encapsulation material 90 is deposited over semiconductor device 72 in a compression molding process. Encapsulation material 90 includes polymer material, epoxy, or other suitable insulating and/or dielectric materials. Source contact 34 and drain contact 36 are exposed and available for attachment to other semiconductor devices.

Embodiments provide a semiconductor device including a chip, for example a power chip or a power transistor, attached to a carrier and including a convertible layer deposited on the chip and the carrier. The convertible layer is deposited in an electrically conducting state and is configured for structuring and/or patterning subsequent to being converted to an electrically insulating state.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of semiconductor devices including a layer that is convertible between electrically conducting and electrically insulating states, as discussed herein. Therefore, it is intended that this invention be limited only by the claims and the equivalents thereof.

What is claimed is:

1. A method of manufacturing a semiconductor device, the method comprising:
   providing a chip on a carrier;
   applying an electrically conducting layer to the chip and the carrier;
   applying a masking layer over the electrically conducting layer which defines selected portions of the electrically conducting layers for conversion to an electrically insulating layer;

converting the selected portions of the electrically conducting layer into the electrically insulating layer; and removing the masking layer, wherein remaining portions of the electrically conducting layers which have not been converted to the electrically insulating layer form electrical pathways for making electrical connections to the chip.

2. The method of claim 1, wherein applying an electrically conducting layer comprises applying a polymer doped with a charge carrier.

3. The method of claim 2, wherein the polymer comprises one of polythiophene, polyppyrrole, polysulfonen, polyaniline, polyindophenine, a derivative of polystyrene, and poly(3,4-ethylendioxythiophen).

4. The method of claim 2, wherein the polymer is doped by electron addition.

5. The method of claim 2, wherein the polymer is doped by electron removal.

6. The method of claim 2, wherein the polymer is chemically doped by exposing the polymer to an oxidant.

7. The method of claim 2, wherein the polymer is electrochemically doped by exposing the polymer to an electrolyte solution and transferring a counter-ion from the electrolyte solution to the polymer.

8. The method of claim 2, wherein converting the electrically conducting layer into an electrically insulating layer comprises deactivating the charge carrier.

9. The method of claim 8, wherein deactivating the charge carrier comprises at least one of de-doping the charge carrier, mechanically deactivating the charge carrier, thermally deactivating the charge carrier, energetically deactivating the charge carrier, selectively patterning the electrically conducting layer to selectively deactivate the charge carrier, and chemically deactivating the charge carrier.

10. The method of claim 1, wherein the chip comprises at least one contact element on a first main face opposite a second main face that faces the carrier.

11. The method of claim 10, wherein the chip comprises at least one transistor comprising a first electrode on the first main face and a second electrode on the second main face.

12. The method of claim 1, wherein the chip comprises a power transistor.

13. The method of claim 1, further comprising:
placing a second chip on the carrier and applying the electrically conducting layer to the second chip.

14. The method of claim 1, further comprising:
encapsulating the chip and at least portions of the carrier in a molding material.

15. A method of manufacturing a semiconductor device, the method comprising:
providing a chip on a carrier;
applying an electrically conducting layer over selected portions of the chip and the carrier;
applying a metal layer over the electrically conducting layer, wherein the electrical conductivity of the electrically conducting layer enhances application and bonding of the metal layer to the electrically conducting layer; and
subsequently converting the electrically conducting layer to an electrically insulating layer, wherein the metal layer provides for electrical connection to the chip, including between the chip and the carrier.

16. The method of claim 15, wherein the electrically conducting layer comprises a polymer material doped with charge carrier, and wherein converting the electrically conducting layer to an electrically insulating layer comprises de-doping the charge carrier.

* * * * *